(12) United States Patent
Dudek

(10) Patent No.: US 11,171,226 B2
(45) Date of Patent: Nov. 9, 2021

(54) GAAS BASED IGBT SEMICONDUCTOR STRUCTURE

(71) Applicant: 3-5 Power Electronics GmbH, Dresden (DE)

(72) Inventor: Volker Dudek, Ettlingen (DE)

(73) Assignee: 3-5 Power Electronics GmbH, Dresden (DE)

( * ) Notice: Subject to any disclaimer, the term of this patent is extended or adjusted under 35 U.S.C. 154(b) by 0 days.

(21) Appl. No.: 15/856,787

(22) Filed: Dec. 28, 2017

(65) Prior Publication Data

US 2018/0182874 A1    Jun. 28, 2018

(30) Foreign Application Priority Data

Dec. 28, 2016    (DE) .................... 10 2016 015 475.6

(51) Int. Cl.
*H01L 29/739*    (2006.01)
*H01L 29/36*    (2006.01)
(Continued)

(52) U.S. Cl.
CPC ...... *H01L 29/7395* (2013.01); *H01L 29/0696* (2013.01); *H01L 29/105* (2013.01);
(Continued)

(58) Field of Classification Search
CPC ............... H01L 29/7395; H01L 29/207; H01L 29/7397; H01L 29/20; H01L 29/105;
(Continued)

(56) References Cited

U.S. PATENT DOCUMENTS 5,359,220 A    10/1994 Larson et al.
5,877,518 A *    3/1999 Sakurai ................. H01L 29/205
                                                            257/139

(Continued)

FOREIGN PATENT DOCUMENTS

DE    102015208097 A1    11/2016
EP       0603737 A2       6/1994
(Continued)

OTHER PUBLICATIONS

G.K. Dalapati et al., IEEE Transactions on Electronc Devices, vol. 60, No. 1, Jan. 2013, "Impact of Buffer Layer on Atomic Layer Deposited TiA10 Alloy Dielectric Quality for Epitaxial-GaAs/Ge Device Application", pp. 192-199.

(Continued)

*Primary Examiner* — Khiem D Nguyen
(74) *Attorney, Agent, or Firm* — Muncy, Geissler, Olds & Lowe, P.C.

(57) ABSTRACT

IGBT semiconductor structure having a $p^+$ substrate, an $n^-$ layer, at least one p region adjacent to the $n^-$ layer, and at least one $n^+$ region adjacent to the p region, a dielectric layer and three terminal contacts. The p region forms a first p-n junction together with the $n^-$ layer, and the $n^+$ region forms a second p-n junction together with the at least one p region. The dielectric layer covers the first p-n junction and the second p-n junction. The second terminal contact is implemented as a field plate on the dielectric layer and a doped intermediate layer with a layer thickness of 1 μm-50 μm and a dopant concentration of $10^{12}$-$10^{17}$ cm$^{-3}$ is arranged between the $p^+$ substrate and the $n^-$ layer, wherein the intermediate layer is integrally joined to at least the $p^+$ substrate.

30 Claims, 3 Drawing Sheets

(51) Int. Cl.
*H01L 29/20* (2006.01)
*H01L 29/06* (2006.01)
*H01L 29/10* (2006.01)
*H01L 29/207* (2006.01)

(52) U.S. Cl.
CPC ............ *H01L 29/20* (2013.01); *H01L 29/207* (2013.01); *H01L 29/36* (2013.01); *H01L 29/7397* (2013.01); *H01L 29/7396* (2013.01)

(58) Field of Classification Search
CPC ................. H01L 29/36; H01L 29/0696; H01L 29/66325; H01L 29/7393; H01L 21/02546; H01L 29/2654; H01L 21/2654; H01L 29/7396; H01L 29/0688
USPC .................................................. 257/133, 139
See application file for complete search history.

(56) References Cited

U.S. PATENT DOCUMENTS

| | | | |
|---|---|---|---|
| 5,904,510 A * | 5/1999 | Merrill .............. | H01L 29/66333 438/154 |
| 5,952,682 A | 9/1999 | Oshino | |
| 5,962,877 A | 10/1999 | Sakurai et al. | |
| 7,825,480 B2 | 11/2010 | Arai et al. | |
| 7,902,542 B2 * | 3/2011 | Haase ..................... | H01L 33/08 257/13 |
| 8,022,474 B2 * | 9/2011 | Haeberlen ........... | H01L 29/7813 257/331 |
| 8,546,223 B2 | 10/2013 | Arai et al. | |
| 8,614,478 B2 * | 12/2013 | Mauder ................. | H01L 29/407 257/328 |
| 8,723,259 B2 | 5/2014 | Nakao et al. | |
| 8,878,594 B2 * | 11/2014 | Patti .................... | H01L 29/0834 257/273 |
| 9,006,819 B2 | 4/2015 | Hino et al. | |
| 9,159,819 B2 | 10/2015 | Pfirsch et al. | |
| 9,166,005 B2 * | 10/2015 | Schulze ............... | H01L 29/165 |
| 9,184,248 B2 * | 11/2015 | Zeng ................... | H01L 29/7802 |
| 9,425,153 B2 * | 8/2016 | Matocha ............. | H01L 29/0615 |
| 9,647,083 B2 | 5/2017 | Schloegl et al. | |
| 9,653,540 B2 * | 5/2017 | Weber ................. | H01L 29/0634 |
| 2003/0057522 A1 * | 3/2003 | Francis ................. | H01L 29/167 257/566 |
| 2003/0155610 A1 * | 8/2003 | Schlogl ............... | H01L 29/7802 257/335 |
| 2006/0035436 A1 * | 2/2006 | Schulze ............ | H01L 29/66333 438/345 |
| 2008/0157117 A1 * | 7/2008 | McNutt ............... | H01L 29/0692 257/133 |
| 2009/0206420 A1 * | 8/2009 | Stecher ............... | H01L 29/7816 257/390 |
| 2011/0278599 A1 * | 11/2011 | Nakao ................. | H01L 29/1095 257/77 |
| 2011/0291186 A1 * | 12/2011 | Yilmaz ............... | H01L 29/4236 257/334 |
| 2012/0220091 A1 * | 8/2012 | Challa ................. | H01L 29/7804 438/270 |
| 2013/0140602 A1 * | 6/2013 | Chang .................. | H01L 25/072 257/139 |
| 2014/0004696 A1 * | 1/2014 | Kitabayashi ........ | H01L 21/0485 438/597 |
| 2014/0015005 A1 * | 1/2014 | Ishii ......................... | F02P 3/05 257/139 |
| 2014/0117502 A1 * | 5/2014 | Laven ............... | H01L 21/26506 257/607 |
| 2014/0217407 A1 | 8/2014 | Mizushima et al. | |
| 2014/0299888 A1 | 10/2014 | Nakao et al. | |
| 2014/0306284 A1 * | 10/2014 | Mauder ................. | H01L 29/105 257/330 |
| 2015/0048414 A1 * | 2/2015 | Patti .................... | H01L 29/0804 257/139 |
| 2015/0108565 A1 * | 4/2015 | Darwish ............. | H01L 29/0634 257/330 |
| 2015/0179636 A1 * | 6/2015 | Pfirsch .............. | H01L 29/66348 257/140 |
| 2015/0255547 A1 * | 9/2015 | Yuan ................... | H01L 27/0629 257/76 |
| 2016/0141406 A1 * | 5/2016 | Haertl ............... | H01L 29/66325 257/340 |
| 2016/0149028 A1 * | 5/2016 | Jin ...................... | H01L 21/2652 257/329 |
| 2016/0293423 A1 * | 10/2016 | Yamada ............. | H01L 21/0475 |
| 2016/0322472 A1 * | 11/2016 | Schloegl ........... | H01L 29/66325 |
| 2017/0032966 A1 * | 2/2017 | Laven ............... | H01L 23/53214 |
| 2017/0062568 A1 * | 3/2017 | Caspary ............. | H01L 29/7393 |
| 2017/0243963 A1 | 8/2017 | Schloegl et al. | |
| 2017/0309713 A1 * | 10/2017 | Hirler ................. | H01L 29/7806 |

FOREIGN PATENT DOCUMENTS

| | | |
|---|---|---|
| EP | 0780905 A1 | 6/1997 |
| JP | H0837294 A | 2/1996 |
| JP | 2001077357 A | 3/2001 |
| JP | 2005286042 A | 10/2005 |
| JP | 2009016482 A | 1/2009 |
| JP | 2014082521 A | 5/2014 |
| JP | 2015156489 A | 8/2015 |
| WO | WO2010/098294 A1 | 8/2012 |

OTHER PUBLICATIONS

M. Xu et al., "New Insight into Fermi-Level Unpinning on GaAs: Impact of Different Surfaces Orientations", 2009 IEEE, pp. 35.5.1-35.5.4.
Josef Lutz et al, "Semiconductor Power Devices", Springer Heidelberg Dordrecht London New York, 2011, pp. 322-333, 330, ISBN 978-3-642-11124-2.
"GaAs Power Devices", German Ashkinazi, 1999, Chapter 5 p. 97, Chapter 7.8 p. 225, ISBN: 965-7094-19-4.
M. Hossin et al, "Evaluation of GaAs Schottky gate bipolar transistor (SGBT) by electrothermal simulation", 2000 Elsevier Science Ltd., Pergamon Solid-State Electronics 44 (2000) 85-94.pp. 85-94.

* cited by examiner

GAAS BASED IGBT SEMICONDUCTOR STRUCTURE

This nonprovisional application claims priority under 35 U.S.C. § 119(a) to German Patent Application No. 10 2016 015 475.6, which was filed in Germany on Dec. 28, 2016, and which is herein incorporated by reference.

BACKGROUND OF THE INVENTION

Field of the Invention

The invention relates to an IGBT semiconductor structure having a $p^+$ substrate, an $n^-$ layer, a p region, an $n^+$ region, a dielectric layer, and three terminal contacts.

Description of the Background Art

IGBTs are known in various implementations from Josef Lutz et al., "Semiconductor Power Devices," Springer Verlag, 2011, ISBN 978-3-642-11124-2, Chapter 10, pp. 322, 323, and 330. Such power devices are manufactured on the basis of silicon or SiC.

A high-voltage semiconductor diode $p^+$-n-$n^+$ and a high-voltage p-n-i-p transistor based on GaAs are known from "GaAs Power Devices," by German Ashkinazi, ISBN 965-7094-19-4, Chapter 5, p. 97 and Chapter 7.8, p. 225.

A deposition of oxide layers on GaAs, for example by means of an atomic layer deposition (ALD) process, is described in the articles, "New Insight into Fermi-Level Unpinning on GaAs: Impact of Different Surface Orientations," M. Xu et al., Electron Device Meeting (IEDM), IEEE, 2009, pp. 865-868, and in "Impact of Buffer Layer on Atomic Layer Deposited TiAlO Alloy Dielectric Quality for Epitaxial-GaAs/Ge Device Application," G. K. Dalapati et al., IEEE Transactions on Electron Devices, Vol. 60, No. 1, 2013.

SUMMARY OF THE INVENTION

It is therefore an object of the invention to provide a device that advances the state of the art.

According to an exemplary embodiment of the invention, an IGBT semiconductor structure having a top and a bottom is provided.

The IGBT semiconductor structure has a $p^+$ substrate formed on the bottom of the IGBT semiconductor structure, and an $n^-$ layer resting on the $p^+$ substrate.

The $n^-$ layer has an adjacent p region and at least one $n^+$ region adjacent to the p region.

A dielectric layer can include a deposited oxide, a first terminal contact connected in an electrically conductive manner to the bottom of the IGBT semiconductor structure, a second terminal contact, and a third terminal contact.

The $p^+$ substrate has a dopant concentration of $5 \cdot 10^{18}$-$5 \cdot 10^{20}$ cm$^{-3}$ and a layer thickness of 50-500 µm.

The $n^-$ layer has a dopant concentration of $10^{12}$-$10^{17}$ cm$^{-3}$ and a layer thickness of 10-300 µm.

The at least one p region has a dopant concentration of $10^{14}$-$10^{18}$ cm$^{-3}$, and the at least one $n^+$ region has a dopant concentration of at least $10^{19}$ cm$^{-3}$, wherein the at least one p region forms a first p-n junction together with the $n^-$ layer.

The at least one $n^+$ region forms a second p-n junction together with the one p region.

The $p^+$ substrate, the $n^-$ layer, the p region, and the $n^+$ region each can include a GaAs compound or are each made of a GaAs compound.

The first terminal contact, the second terminal contact, and the third terminal contact can each include a metal or a metal compound, or can each be made of a metal or a metal compound, wherein the second terminal contact is implemented as a field plate on the dielectric layer.

The third terminal contact can be connected in an electrically conductive manner to the at least one p region and the at least one $n^+$ region.

For example, the terminal contacts can each be arranged on the surface of the semiconductor structure.

The dielectric layer can cover at least the first p-n junction and the second p-n junction, and is integrally joined to the $n^-$ layer, the p region, and the $n^+$ region.

In addition, a doped intermediate layer with a layer thickness of 1 µm-50 µm and a dopant concentration of $10^{12}$-$10^{17}$ cm$^{-3}$ is arranged between the $p^+$ substrate and the $n^-$ layer, wherein the intermediate layer is integrally joined to at least the $p^+$ substrate.

It should be noted that the second terminal contact can be referred to as a gate. The first terminal contact can be referred to as a collector or anode, while the third terminal contact can be referred to as an emitter or cathode.

It is a matter of course that the terminal contacts are designed as layers. The terminal contacts are each electrically conductive and have metallic properties and include or preferably are made of metallically conductive semiconductor layers or metal layers or a combination of both. The terminal contacts provide a low electrical resistance contact to the directly adjacent doped semiconductor layers.

In addition, the terminal contacts can be connected by bond wires to contact fingers, or so-called pins.

The intermediate layer can have at least a different dopant concentration in comparison with the adjacent layers.

An advantage is that in GaAs semiconductor structures, the charge carriers have a smaller effective mass as compared to silicon. In addition, higher temperatures as compared to silicon can be achieved at the p-n junctions without the components being destroyed. In this way, higher switching frequencies and lower losses can be achieved with the GaAs semiconductor structures than with the comparable Si semiconductor structures.

Another advantage is that the III-IV IGBT semiconductor structure can be manufactured more economically than comparable semiconductor structures made of SiC.

An additional advantage of the III-V IGBT semiconductor structure according to the invention is a high thermal stability of up to 300° C. In other words, the III-V semiconductor diodes can also be used in hot environments.

In an embodiment, the intermediate layer is p-doped in design and, can include zinc and/or silicon as dopants. The dopant concentration in the intermediate layer preferably is lower than the dopant concentration in the $p^+$ layer. For example, the dopant concentration can be lower in a range between a factor of 2 to a factor of five orders of magnitude.

In an embodiment, the intermediate layer can be n-doped in design and can include silicon and/or tin as dopant. The dopant concentration in the intermediate layer can be lower than the dopant concentration in the $n^+$ substrate. For example, the dopant concentration can be up to a factor of 100 lower than in the $n^-$ layer.

According to an embodiment, the IGBT semiconductor structure can have an n-doped buffer layer, wherein the buffer layer is arranged between the intermediate layer and the $n^-$ layer, can have a dopant concentration of $10^{12}$-$10^{16}$ cm$^{-3}$ and a layer thickness of 1 µm-50 µm, and includes a GaAs compound or is made of a GaAs compound.

In an embodiment, the IGBT semiconductor structure can be implemented as a trench IGBT semiconductor structure, wherein the dielectric layer can be substantially perpendicular or perpendicular to the top of the IGBT semiconductor structure.

The $p^+$ substrate can include zinc. The $n^-$ layer and/or the $n^+$ region can include silicon and/or chromium and/or palladium and/or tin, wherein the IGBT semiconductor structure can be monolithic in design.

According to an embodiment, a total height of the IGBT semiconductor structure can be a maximum of 150-500 µm, and/or an edge length or a diameter of the IGBT semiconductor structure can be between 1 mm and 15 mm.

In an embodiment, the p region and/or the n region on the top of the IGBT semiconductor structure can be designed to be circular or straight with semicircles arranged on the face of the structures in each case.

According to an embodiment, the dielectric layer can include a deposited oxide, and has a layer thickness of 10 nm to 1 µm.

In a further embodiment, the stacked layer structure can have a semiconductor bond formed between the n– layer and the p+ substrate.

It is noted that the term semiconductor bond can be used synonymously with the term wafer-bond.

In an embodiment, the layer structure formed of a p+ substrate forms a first partial stack and the layer structure comprising the n+ layer, the n– layer, and optionally the buffer layer forms a second partial stack.

In an embodiment, the stacked layer structure comprises an intermediate layer arranged between the p+ substrate and the n– layer. In this case, the first part stack comprises the intermediate layer. The semiconductor bond is arranged between the intermediate layer and the n– layer or between the intermediate layer and the buffer layer.

In an embodiment, the first partial stack and the second partial stack are each formed monolithically.

In an embodiment, the first partial stack is formed, in which, starting from a p+ substrate by epitaxial growth, the intermediate layer is produced. For example, the intermediate layer formed as p– layer has a doping less than $10^{13}$ $N/cm^{-3}$, that is the interlayer is intrinsically doped or doped between $10^{13}$ $N/cm^{-3}$ and $10^{13}$ $N/cm^{-3}$. In an embodiment, the p+ substrate is thinned before or after bonding by a grinding process to a thickness between 200 µm and 500 µm.

In an embodiment, the second stack is formed by starting from an n– substrate, the n– substrate with the second stack, can be connected to the n+ layer through a wafer bonding process. In an embodiment, the n+ layer can be formed as an n+ substrate.

In a further process step, the n– substrate can be thinned to a desired thickness.

In an embodiment development, after a thinning of the n– substrate or the n– layer, the buffer layer is generated by an epitaxy process.

The thickness of the n– substrate or the n– layer can be in a range between 50 µm to 250 µm. For example, the doping of the n-type substrate can be in a range between $10^{13}$ $N/cm^{-3}$ and $10^{15}$ $N/cm^{-3}$. An advantage of wafer bonding is that thick n– layers can be readily prepared. This eliminates a long epitaxial deposition process. The number of stacking faults can also be reduced by wafer bonding.

In an embodiment, the n– substrate has a doping greater than $10^{10}$ $N/cm^{-3}$ and less than $10^{13}$ $N/cm^{-3}$. In that the doping is extremely low, the n– substrate can also be considered as an intrinsic layer.

In an embodiment, the n– substrate or the surface of the buffer layer can be connected directly to the first stack by a semiconductor bonding process step. Subsequently, the backside of the n– substrate can be thinned to the desired thickness of the n– layer. After thinning the n– substrate or the n– layer, the n+ layer with a doping in a range between $10^{18}$ $N/cm^{-3}$ and smaller than $5 \times 10^{19}$ $N/cm^{-3}$ is produced by means of epitaxy or a high-dose implantation.

The thinning of the n-type substrate can be accomplished by a CMP step, or done by chemical mechanical polishing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
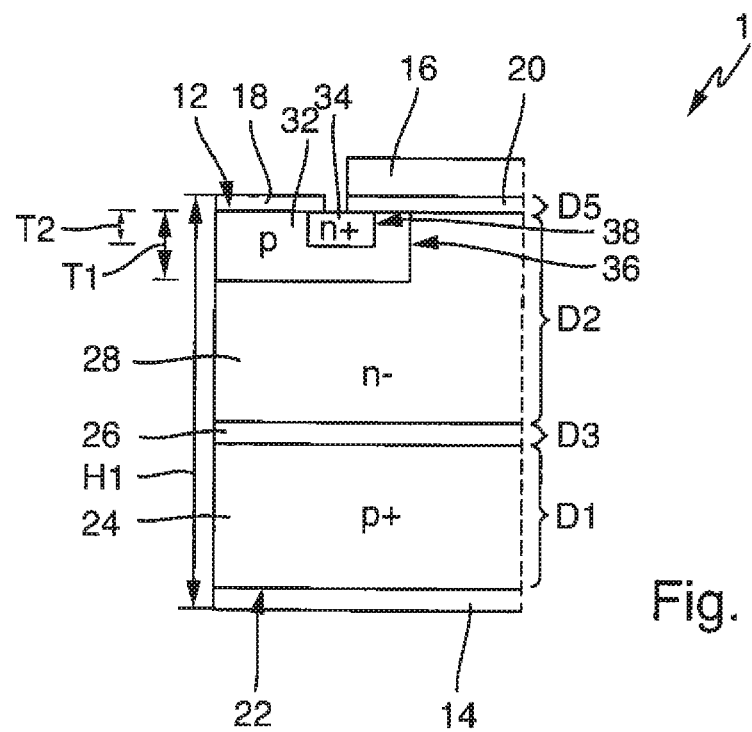
FIG. 1 shows a schematic view of an embodiment according to the invention of an IGBT.

The illustration in FIG. 1 shows a cross-sectional view of a first embodiment of an IGBT semiconductor structure 10 with three terminal contacts 14, 16, 18 as well as a dielectric layer 20. The IGBT semiconductor structure 10, hereinafter also referred to as semiconductor structure 10, is stacked in design with a top 12 and a bottom 22, and in the exemplary embodiment shown has a so-called non-punch-through design and a total height H1.

The first terminal contact 14 is implemented as a metal layer, wherein the metal layer is integrally joined to the bottom 22 of the semiconductor structure 10.

A $p^+$ substrate 24 forms the bottommost layer of the IGBT semiconductor structure. The $p^+$ substrate thus forms the bottom 22 of the semiconductor structure 10, and has a layer thickness D1. The $p^+$ substrate is followed by a thin, lightly n-doped or lightly p-doped intermediate layer 26 with a layer thickness D3, and an $n^-$ layer 28 with a layer thickness D2 in the said sequence.

In the exemplary embodiment shown, the $n^-$ layer 28 forms at least a part of the top 12 of the semiconductor structure 10. Another part of the top 12 of the semiconductor structure 10 is composed of a p region 32, wherein the p region 32 extends from the top 12 of the IGBT semiconductor structure 10 down to a depth T1 in the $n^-$ layer.

Another part of the top 12 of the semiconductor structure 10 is composed of an n⁺ region 34, wherein the n⁺ region extends from the top 12 of the semiconductor structure 10 down to a depth T2 in the p region, and T2 is less than T1.

Adjacent to the top 12 of the semiconductor structure 10, a first p-n junction 36 between the p region and the n⁻ layer and a second p-n junction 38 between the n⁺ region and the p region are thus formed, wherein the dielectric layer 20 covers at least the first p-n junction 36 and the second p-n junction 38 and is integrally joined to the top 12 of the semiconductor structure 10, in particular to the n⁺ region, the p region, and the n⁻ layer, and has a layer thickness D5.

The second terminal contact 16 is implemented as a field plate on a surface of the dielectric layer 20 facing away from the semiconductor structure 10.

The third terminal contact 18 is likewise implemented as a metal layer, wherein the metal layer is integrally joined to a part of the top 12 of the semiconductor structure 10 formed by the p region and the n⁺ region.

The n⁺ region 34, the p region 32, and the n⁻ layer 28, together with the dielectric layer 20 and the three terminal contacts 14, 16, 18, form a MOS transistor, which is to say a bipolar component, while the p substrate 24, intermediate layer 26, and n⁻ layer 28 represent a PIN diode.

Figure 2:
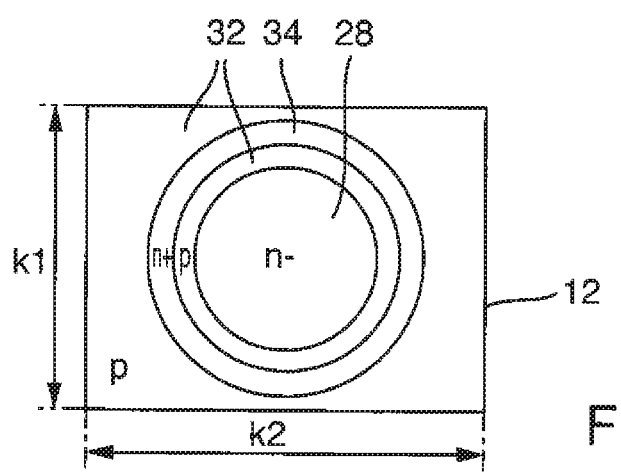
FIG. 2 shows a schematic top view of an embodiment according to the invention of an IGBT.

Shown in the illustration in FIG. 2 is a top view of the top 12 of the IGBT semiconductor structure 10. The p region 32 and the n⁺ region 34 are both circular in design. The IGBT semiconductor structure 10 has a rectangular top 12 with a first edge length K1 and a second edge length K2.

Figure 3:
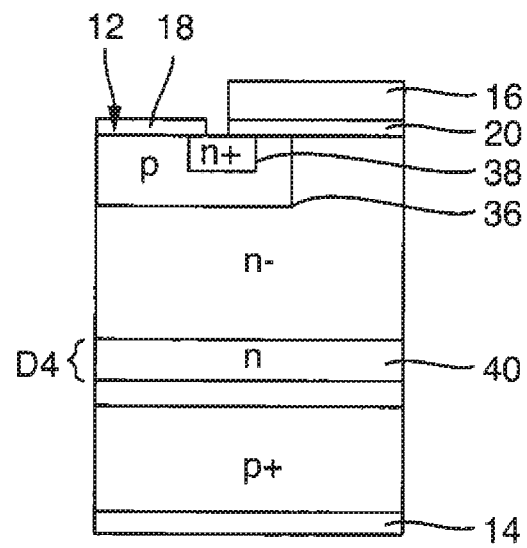
FIG. 3 shows a schematic view of an embodiment according to the invention of an IGBT.

Shown in the illustration in FIG. 3 is another embodiment of the IGBT semiconductor structure 10. Only the differences from the illustration in FIG. 1 are explained below. The semiconductor structure 10 is implemented as a so-called punch-through IGBT, wherein a lightly n-doped or p-doped buffer layer 40 with a layer thickness D4 is arranged between the intermediate layer 26 and the n layer 28.

Figure 4:
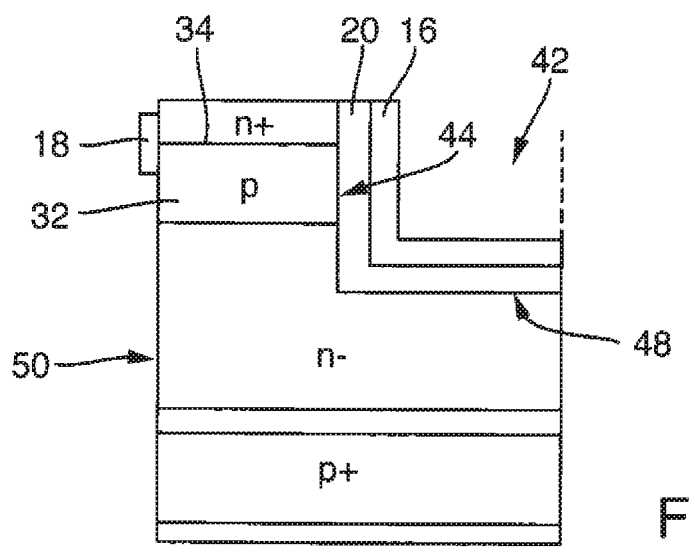
FIG. 4 shows a schematic view of an embodiment according to the invention of an IGBT.

Shown in the illustration in FIG. 4 is another embodiment of an IGBT semiconductor structure 10. Only the differences from the illustrations in FIGS. 1 and 3 are explained below. The semiconductor structure 10 is implemented as a so-called trench IGBT.

The p region 32 and the n⁺ region 34 are each implemented as layers on the n⁻ layer or the p region 32 respectively, wherein the semiconductor structure 10 has a trench 42 extending from the top 12 through the n-region layer and the p-region layer down into the n⁻ layer.

The first p-n junction 36 and the second p-n junction 38 are perpendicular to a side surface 44 of the trench 42. The side surface 44 and a bottom 46 of the trench are covered with the dielectric layer 20. The second terminal contact 16 implemented as a field plate extends correspondingly on the dielectric layer 20. The third terminal contact 18 is arranged on a side surface 50 of the semiconductor structure 10 opposite the side surface 44 of the trench 42, and is connected in an electrically conductive manner to the n⁺ region 34 in layer form and to the p region 32 in layer form.

Figure 6:
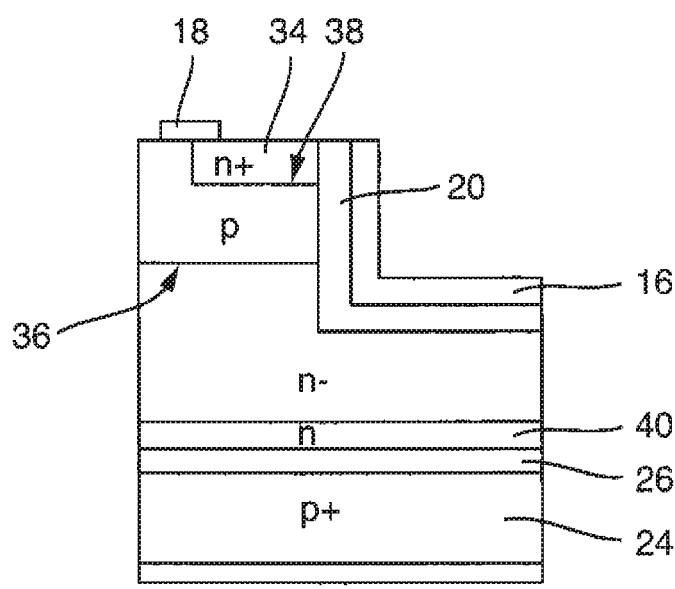
FIG. 6 shows a schematic view of an embodiment according to the invention of an IGBT.

In an alternative embodiment, shown in FIG. 6, the third terminal contact 18 is arranged on the top 12. In other words, the second p-n junction 38 is also implemented on the surface, in a manner corresponding to the embodiment shown in FIG. 1.

Figure 5:
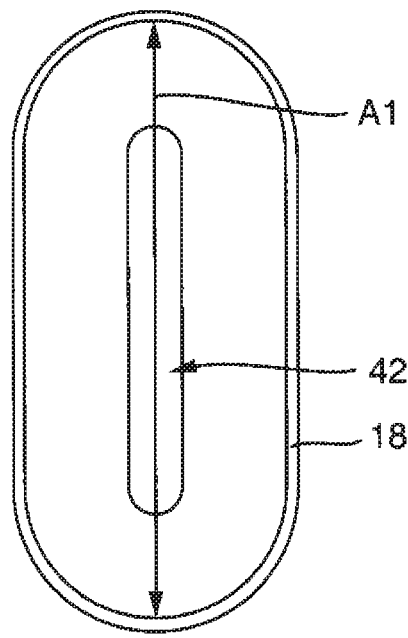
FIG. 5 shows a schematic top view of an embodiment according to the invention of an IGBT.

FIG. 5 shows a schematic top view of the trench IGBT from FIG. 4. The trench 42 has an elongated, circular shape, and the IGBT semiconductor structure 10 has a diameter A1.

Shown in the illustration in FIG. 6 is another embodiment of the IGBT semiconductor structure 10. Only the differences from the illustration in FIG. 4 are explained below. The semiconductor structure 10, which is likewise implemented as a trench IGBT, has a buffer layer 40 between the intermediate layer 26 and the n⁻ layer 28.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An IGBT semiconductor structure comprising:
   a p⁺ substrate formed on a bottom of the IGBT semiconductor structure with a dopant concentration of $5 \cdot 10^{18}$-$5 \cdot 10^{20}$ cm⁻³, a layer thickness of 50-500 μm, and that includes a GaAs compound or is made of a GaAs compound;
   an n⁻ layer with a dopant concentration of $10^{12}$-$10^{17}$ cm⁻³, a layer thickness of 10-300 μm, and that includes a GaAs compound or is made of a GaAs compound;
   at least one p region arranged adjacent to the n⁻ layer with a dopant concentration of $10^{14}$-$10^{18}$ cm⁻³, and that includes a GaAs compound or is made of a GaAs compound;
   at least one n⁺ region arranged adjacent to the p region with a dopant concentration of at least $10^{19}$ cm⁻³, and that includes a GaAs compound or is made of a GaAs compound;
   a dielectric layer;
   a first terminal contact connected in an electrically conductive manner to the bottom of the IGBT semiconductor structure, the first terminal contact includes a metal or a metal compound or is made of a metal or a metal compound;
   a second terminal contact and a third terminal contact, each of which includes a metal or a metal compound or is made of a metal or a metal compound;
   wherein the at least one p region forms a first p-n junction together with the n⁻ layer;
   wherein the at least one n+ region forms a second p-n junction together with the at least one p region;
   wherein the dielectric layer covers at least the first p-n junction and the second p-n junction and is integrally joined to the n⁻ layer, the p region, and the n⁺ region,
   wherein the second terminal contact is a field plate on the dielectric layer,
   wherein the third terminal contact is connected in an electrically conductive manner to the at least one p region and the at least one n⁺ region,
   wherein a doped intermediate layer with a layer thickness of 1 μm-50 μm and a dopant concentration of $10^{12}$-$10^{17}$ cm⁻³ is arranged between the p⁺ substrate and the n⁻ layer, the doped intermediate layer being integrally joined to at least the p⁺ substrate,
   wherein a total height of the IGBT semiconductor structure is a maximum of 150-500 μm,
   wherein the dielectric layer includes a deposited oxide and has a layer thickness from 10 nm to 1 μm, and
   wherein the IGBT semiconductor structure has a trench extending from a top of the IGBT semiconductor structure through the n⁺ region and the p region into the p⁻ layer.

2. The IGBT semiconductor structure according to claim 1, wherein the intermediate layer is p-doped.

3. The IGBT semiconductor structure according to claim 2, wherein a dopant concentration in the intermediate layer is lower than a dopant concentration in the p⁺ substrate or wherein the dopant concentration in the intermediate layer is lower than the dopant concentration in the p+ substrate in a range between a factor of 2 and a factor of five orders of magnitude.

4. The IGBT semiconductor structure according to claim 2, wherein the intermediate layer includes zinc or silicon.

5. The IGBT semiconductor structure according to claim 1, wherein the intermediate layer is n-doped.

6. The IGBT semiconductor structure according to claim 5, wherein the intermediate layer includes silicon and/or tin.

7. The IGBT semiconductor structure according to claim 5, wherein the dopant concentration in the intermediate layer is lower than the dopant concentration in the n– layer by up to a factor of 100.

8. The IGBT semiconductor structure according to claim 1, wherein the IGBT semiconductor structure has an n-doped buffer layer, wherein the buffer layer is arranged between the intermediate layer and the $n^-$ layer, has a dopant concentration of $10^{12}$-$10^{17}$ cm$^{-3}$ and a layer thickness of 1 µm-50 µm, and includes a GaAs compound or is made of a GaAs compound.

9. The IGBT semiconductor structure according to claim 1, wherein the IGBT semiconductor structure is a trench IGBT semiconductor structure, and wherein the dielectric layer is substantially perpendicular to a top of the IGBT semiconductor structure.

10. The IGBT semiconductor structure according to claim 1, wherein the p+ substrate includes zinc.

11. The IGBT semiconductor structure according to claim 1, wherein the $n^-$ layer and/or the $n^+$ region include silicon and/or chromium and/or palladium and/or tin.

12. The IGBT semiconductor structure according to claim 1, wherein the IGBT semiconductor structure is monolithic.

13. The IGBT semiconductor structure according to claim 1, wherein the p region and/or the $n^+$ region on a top of the IGBT semiconductor structure is oval or circular in design.

14. The IGBT semiconductor structure according to claim 1, wherein the IGBT semiconductor structure has edge lengths or a diameter from 1 mm to 15 mm.

15. The IGBT semiconductor structure according to claim 1, wherein the $n^-$ layer forms a portion of a top of the IGBT semiconductor structure.

16. The IGBT semiconductor structure according to claim 1, wherein the third terminal contact is formed above the at least one p region and the at least one $n^+$ region and does not overlap the $n^-$ layer.

17. The IGBT semiconductor structure according to claim 1, wherein the $p^+$ substrate is connected to the $n^-$ layer by the doped intermediate layer, the doped intermediate layer being a single layer.

18. The IGBT semiconductor structure according to claim 1, wherein the $n^-$ layer is directly connected to the doped intermediate layer.

19. The IGBT semiconductor structure according to claim 1, wherein the IGBT semiconductor is devoid of a $n^+$ layer between the $p^+$ substrate and the $n^-$ layer.

20. The IGBT semiconductor structure according to claim 1, wherein the $p^+$ substrate is connected directly to the $n^-$ layer by the doped intermediate layer.

21. The IGBT semiconductor structure according to claim 1, wherein the $p^+$ substrate is connected directly to the $n^-$ layer solely by the doped intermediate layer.

22. The IGBT semiconductor structure according to claim 1, wherein the $p^+$ substrate is separated from the $n^-$ layer solely by the doped intermediate layer.

23. The IGBT semiconductor structure according to claim 1, wherein the $p^+$ substrate is directly connected to the doped intermediate layer, the doped intermediate layer being a single layer.

24. The IGBT semiconductor structure according to claim 1, wherein the doped intermediate layer is a single layer, and wherein the $n^-$ layer is directly connected to the doped intermediate layer.

25. The IGBT semiconductor structure according to claim 1, wherein the $p^+$ substrate is directly connected to the doped intermediate layer, and
wherein the $n^-$ layer is directly connected to the doped intermediate layer.

26. The IGBT semiconductor structure according to claim 1, wherein the dielectric layer covers a side surface and a bottom surface of the trench.

27. The IGBT semiconductor structure according to claim 1, wherein the second terminal contact is a field plate on the dielectric layer.

28. An IGBT semiconductor structure comprising:
a $p^+$ substrate formed on a bottom of the IGBT semiconductor structure with a dopant concentration of $5\cdot10^{18}$-$5\cdot10^{20}$ cm$^{-3}$, a layer thickness of 50-500 µm, and that includes a GaAs compound or is made of a GaAs compound;
an $n^-$ layer with a dopant concentration of $10^{12}$-$10^{17}$ cm$^{-3}$, a layer thickness of 10-300 µm, and that includes a GaAs compound or is made of a GaAs compound;
at least one p region arranged adjacent to the $n^-$ layer with a dopant concentration of $10^{14}$-$10^{18}$ cm$^{-3}$, and that includes a GaAs compound or is made of a GaAs compound;
at least one $n^+$ region arranged adjacent to the p region with a dopant concentration of at least $10^{19}$ cm$^{-3}$, and that includes a GaAs compound or is made of a GaAs compound;
a dielectric layer;
a first terminal contact connected in an electrically conductive manner to the bottom of the IGBT semiconductor structure, the first terminal contact includes a metal or a metal compound or is made of a metal or a metal compound; and
a second terminal contact and a third terminal contact, each of which includes a metal or a metal compound or is made of a metal or a metal compound,
wherein the at least one p region forms a first p-n junction together with the $n^-$ layer,
wherein the at least one n+ region forms a second p-n junction together with the at least one p region,
wherein the dielectric layer covers at least the first p-n junction and the second p-n junction and is integrally joined to the $n^-$ layer, the p region, and the $n^+$ region,
wherein the second terminal contact is a field plate on the dielectric layer,
wherein the third terminal contact is connected in an electrically conductive manner to the at least one p region and the at least one $n^+$ region,
wherein a doped intermediate layer with a layer thickness of 1 µm-50 µm and a dopant concentration of $10^{12}$-$10^{17}$ cm$^{-3}$ is arranged between the $p^+$ substrate and the $n^-$ layer, the doped intermediate layer being integrally joined to at least the $p^+$ substrate,
wherein the $p^+$ substrate is directly connected to the doped intermediate layer, the doped intermediate layer being a single layer,
wherein the $n^-$ layer is directly connected to the doped intermediate layer, wherein a total height of the IGBT semiconductor structure is a maximum of 150-500 µm,
wherein the dielectric layer includes a deposited oxide and has a layer thickness from 10 nm to 1 µm, and
wherein the IGBT semiconductor structure has a trench extending from a top of the IGBT semiconductor structure through the n⁺ region and the p region into the n⁻ layer.

29. An IGBT semiconductor structure comprising:
a p⁺ substrate formed on a bottom of the IGBT semiconductor structure and that includes a GaAs compound or is made of a GaAs compound;
an n⁻ layer that includes a GaAs compound or is made of a GaAs compound;
at least one p region arranged adjacent to the n⁻ layer that includes a GaAs compound or is made of a GaAs compound;
at least one n⁺ region arranged adjacent to the p region that includes a GaAs compound or is made of a GaAs compound;
a dielectric layer;
a first terminal contact connected in an electrically conductive manner to the bottom of the IGBT semiconductor structure, the first terminal contact includes a metal or a metal compound or is made of a metal or a metal compound;
a second terminal contact and a third terminal contact, each of which includes a metal or a metal compound or is made of a metal or a metal compound;
wherein the at least one p region forms a first p-n junction together with the n⁻ layer;
wherein the at least one n+ region forms a second p-n junction together with the at least one p region;
wherein the dielectric layer covers at least the first p-n junction and the second p-n junction and is integrally joined to the n⁻ layer, the p region, and the n⁺ region,
wherein the second terminal contact is a field plate on the dielectric layer,
wherein the third terminal contact is connected in an electrically conductive manner to the at least one p region and the at least one n⁺ region,
wherein a doped intermediate layer is arranged between the p⁺ substrate and the n⁻ layer, the doped intermediate layer being integrally joined to at least the p⁺ substrate,
wherein a total height of the IGBT semiconductor structure is a maximum of 150-500 µm,
wherein the dielectric layer includes a deposited oxide and has a layer thickness from 10 nm to 1 µm, and
wherein the IGBT semiconductor structure has a trench extending from a top of the IGBT semiconductor structure through the n⁺ region and the p region into the n⁻ layer.

30. An IGBT semiconductor structure comprising:
a p⁺ substrate formed on a bottom of the IGBT semiconductor structure with a dopant concentration of $5·10^{18}$-$5·10^{20}$ cm⁻³, a layer thickness of 50-500 µm, and that includes a GaAs compound or is made of a GaAs compound;
an n⁻ layer with a dopant concentration of $10^{12}$-$10^{17}$ cm⁻³, a layer thickness of 10-300 µm, and that includes a GaAs compound or is made of a GaAs compound;
at least one p region arranged adjacent to the n⁻ layer with a dopant concentration of $10^{14}$-$10^{18}$ cm⁻³, and that includes a GaAs compound or is made of a GaAs compound;
at least one n⁺ region arranged adjacent to the p region with a dopant concentration of at least $10^{19}$ cm⁻³, and that includes a GaAs compound or is made of a GaAs compound;
a dielectric layer;
a first terminal contact connected in an electrically conductive manner to the bottom of the IGBT semiconductor structure, the first terminal contact includes a metal or a metal compound or is made of a metal or a metal compound;
a second terminal contact and a third terminal contact, each of which includes a metal or a metal compound or is made of a metal or a metal compound;
wherein the at least one p region forms a first p-n junction together with the n⁻ layer;
wherein the IGBT semiconductor structure has a trench extending from a top of the IGBT semiconductor structure through the n⁺ region and the p region into the n⁻ layer,
wherein the dielectric layer covers a side surface and a bottom surface of the trench,
wherein the second terminal contact is a field plate on the dielectric layer,
wherein the third terminal contact is connected in an electrically conductive manner to the at least one p region and the at least one n⁺ region, and
wherein a doped intermediate layer with a layer thickness of 1 µm-50 µm and a dopant concentration of $10^{12}$-$10^{17}$ cm⁻³ is arranged between the p⁺ substrate and the n⁻ layer, the doped intermediate layer being integrally joined to at least the p⁺ substrate.

* * * * *